(12) United States Patent
Yamamoto (10) Patent No.: US 8,017,226 B2
(45) Date of Patent: Sep. 13, 2011

(54) HARD FILM-COATED MEMBER AND JIG FOR MOLDING

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 70 days.

(21) Appl. No.: 12/426,409

(22) Filed: Apr. 20, 2009

(65) Prior Publication Data

US 2009/0317659 A1 Dec. 24, 2009

(30) Foreign Application Priority Data

Jun. 23, 2008 (JP) ................................ 2008-163017

(51) Int. Cl.
*B32B 9/00* (2006.01)
(52) U.S. Cl. ............. 428/216; 408/115 R; 428/336; 428/469; 428/697; 428/698; 428/699; 428/704
(58) Field of Classification Search ........... 428/216, 428/336, 469, 472, 446, 697, 698, 699, 704; 408/115 R
See application file for complete search history.

(56) References Cited

U.S. PATENT DOCUMENTS

| | | | |
|---|---|---|---|
| 6,767,658 B2 * | 7/2004 | Yamamoto et al. | 428/698 |
| 6,824,601 B2 * | 11/2004 | Yamamoto et al. | 428/699 |
| 7,217,466 B2 * | 5/2007 | Weber et al. | 428/699 |
| 7,348,074 B2 * | 3/2008 | Derflinger | 428/216 |
| 7,537,822 B2 * | 5/2009 | Ishikawa | 428/697 |
| 2003/0059632 A1 | 3/2003 | Inoue | |
| 2007/0178330 A1 * | 8/2007 | Sjolen et al. | 428/472 |
| 2008/0171183 A1 | 7/2008 | Yamamoto | |

FOREIGN PATENT DOCUMENTS

| | | |
|---|---|---|
| JP | 06-322517 | * 11/1994 |
| JP | 2000-1768 | 1/2000 |
| JP | 2000-144376 | 5/2000 |
| JP | 2002-307128 | 10/2002 |
| JP | 2002-307129 | 10/2002 |
| JP | 2006-124818 | 5/2006 |

OTHER PUBLICATIONS

Endrino et al "Hard AlTiN, AlCrN PVD coatings for machining of austenitic stainless steel" Surface & Coatings Tech 200 (2006) p. 6840-6845.*

Wadsworth et al "Thermal stability and oxidation resistance of TiAlN/CrN multilayer coatings" Surface & Coatings Tech 94-95 (1997) p. 315-321.*

* cited by examiner

*Primary Examiner* — Archene Turner
(74) *Attorney, Agent, or Firm* — Oblon, Spivak, McClelland, Maier & Neustadt, L.L.P.

(57) ABSTRACT

There are provided a hard film-coated member excellent in wear resistance and adhesion, and a jig for molding. The hard film-coated member includes: a base material including an iron base alloy containing Cr; a first film layer formed with a film thickness of 1 to 10 μm on the surface of the base material; and a second film layer formed with a film thickness of 2 to 10 μm on the surface of the first film layer. The first film layer includes $Cr_{1-a-b}M_aB_b(C_cN_{1-c})$, wherein M is one or more elements selected from W, V, Mo, Nb, Ti, and Al, and a, b, and c each denote the atomic ratio, and satisfy: $0 \leq a \leq 0.7$; $0 \leq b \leq 0.15$; $0 \leq c \leq 0.5$; and $0.3 \leq 1-a-b$. The second film layer includes $Nb_{1-d-e-f}Cr_dAl_eL_f(C_gN_{1-g})$, wherein L is one or more elements selected from Si, Y, and B, and d, e, f, and g each denote the atomic ratio, and satisfy: $0.05 \leq 1-d-e-f \leq 0.5$; $0.05 \leq d \leq 0.5$; $0.4 \leq e \leq 0.7$; $0 \leq f \leq 0.15$; and $0 \leq g \leq 0.5$.

11 Claims, 2 Drawing Sheets

HARD FILM-COATED MEMBER AND JIG FOR MOLDING

BACKGROUND OF THE INVENTION

1. Field of the invention

The present invention relates to a hard film-coated member coated with a hard film on the surface thereof, and a jig for molding using the member.

2. Description of the Related Art

Conventionally, jigs for metal working such as dies have been improved in wear resistance and seizure resistance by a nitriding treatment. Further, in recent years, a study has been conducted on the improvement of the wear resistance and the seizure resistance by gas phase coating such as PVD in place of a nitriding treatment. For example, JP-A No. 2000-144376 discloses a hard film improved in wear resistance by the formation of a composite nitride containing two or more of Cr, Al, Ti, and V. Whereas, JP-A No. 2002-307128 and JP-A No. 2002-307129 disclose a coated jig for warm working excellent in wear resistance or seizure resistance, including a coated layer formed of one or more nitrides, carbides, and carbonitrides of Ti, V, Al, Cr, and Si formed therein, and, optionally, a sulfide layer including Ti and Cr, and the balance of Mo further formed thereon. Further, JP-A No. 2000-1768 discloses a hard film excellent in wear resistance and seizure resistance, including a surface layer containing $MoS_2$ as a main component on a high hardness film; and an article with the film. Further, JP-A No. 2006-124818 discloses a hard film including $(X_c, M_{1-c})(B_aC_bN_{1-a-b})$, where M is one or more of W and V, and X is one or more of elements of Groups 4A and 5A, Al, Si, Fe, Co, and Ni; and a formation method thereof.

However, the hard film including a composite nitride containing two or more of Cr, Al, Ti, and V described in JP-A No. 2000-144376 has high hardness, and is excellent in wear resistance, but is insufficient in seizure resistance. Thus, when plastic working of a metal is carried out under a high surface pressure, or in other cases, the hard film cannot withstand use in a severe environment. Whereas, the coated layer including one or more nitrides, carbides, and carbonitrides of Ti, V, Al, Cr, and Si disclosed in JP-A No. 2002-307129 also similarly has high hardness, but is inferior in seizure resistance.

Then, when the sulfide layer is formed as described in JP-A No. 2002-307128 or JP-A No. 2000-1768, the sulfide is soft, and it is excellent in sliding property (wear resistance) at the beginning of use, but wears with time in use. Thus, the wear resistance cannot be kept over a long period. Whereas, also for the hard film including $(X_c, M_{1-c})(B_aC_bN_{1-a-b})$ described in JP-A No. 2006-124818, as with the case of the sulfide layer, the sliding property (wear resistance) is excellent at the beginning of use, but the wear resistance cannot be kept over a long period.

Further, when the coated layer including nitride, carbide, and carbonitride selected from one or more of Ti, V, Al, Cr, and Si of JP-A No. 2002-307128 or JP-A No. 2002-307129 is directly formed on a low-hardness iron type base material, unfavorably, peeling tends to occur (adhesion decreases) due to a difference in elasticity and plastic deformation behavior from the base material.

SUMMARY OF THE INVENTION

Under such circumstances, the present invention has been made in order to solve such problems. It is therefore an object of the present invention to provide a hard film-coated member excellent in wear resistance and adhesion, and a jig for molding using the same.

In order to solve the problems, according to one aspect of the present invention, there is provided a hard film-coated member which includes: a base material including an iron base alloy containing Cr; a first film layer formed with a film thickness of 1 to 10 μm on the surface of the base material; and a second film layer formed with a film thickness of 2 to 10 μm on the surface of the first film layer, wherein the first film layer includes $Cr_{1-a-b}M_aB_b(C_cN_{1-c})$, in which M is one or more elements selected from W, V, Mo, Nb, Ti, and Al, and a, b, and c each denote the atomic ratio, and satisfy the following relations:

$0 \leq a \leq 0.7$; $0 \leq b \leq 0.15$; $0 \leq c \leq 0.5$; and $0.3 \leq 1-a-b$, and the second film layer includes $Nb_{1-d-e-f}Cr_dAl_eL_f(C_gN_{1-g})$, in which L is one or more elements selected from Si, Y, and B, and d, e, f, and g each denote the atomic ratio, and satisfy the following relations: $0.05 \leq 1-d-e-f \leq 0.5$; $0.05 \leq d \leq 0.5$; $0.4 \leq e \leq 0.7$; $0 \leq f \leq 0.15$; and $0 \leq g \leq 0.5$.

With the configuration, the first film layer including $Cr_{1-a-b}M_aB_b(C_cN_{1-c})$ having an atomic ratio within a prescribed range, (where M is one or more elements selected from W, V, Mo, Nb, Ti, and Al), and having a prescribed film thickness is provided on the surface of the base material. This improves the adhesion between the second film layer containing Al (AlN) which is inferior in adhesion and the base material. Further, the first film layer has a prescribed film thickness. This reduces the difference in deformation behavior under an external stress due to the difference in mechanical characteristics between the second film layer and the base material. As a result, peeling of the second film layer is suppressed, which improves the adhesion of the first film layer with the second film layer. Then, the second film layer including $Nb_{1-d-e-f}Cr_dAl_eL_f(C_gN_{1-g})$ having an atomic ratio within a prescribed range (where L is one or more elements selected from Si, Y, and B), and having a prescribed film thickness is provided on the surface of the first film layer. As a result, the second film layer functions as a wear resistant layer in the hard film-coated member, and suppresses oxidation wear due to heat generation during molding forming, and the sliding wear with the article to be processed. Whereas, the second film layer has a prescribed film thickness. This suppresses peeling of the second film layer, and also improves the adhesion thereof.

Further, in the hard film-coated member according to another aspect of the present invention, it is preferable that the first film layer includes CrN of $Cr_{1-a-b}M_aB_b(C_cN_{1-c})$, in which a=0, b=0, and c=0, and the second film layer includes $Nb_{1-d-e}Cr_dAl_eN$ of $Nb_{1-d-e-f}Cr_dAl_eL_f(C_gN_{1-g})$, in which f=0 and g=0, and d and e satisfy the following relations: $0.1 \leq 1-d-e \leq 0.3$; $0.1 \leq d \leq 0.3$; and $0.5 \leq e \leq 0.6$.

With the configuration, the first film layer includes CrN. This ensures the high adhesion between the base material and the first film layer and the second film layer. Then, the second film layer includes $Nb_{1-d-e}Cr_dAl_eN$ having an atomic ratio within the specific range. This suppresses the oxidation wear of the second film layer at a high level. In addition, the second film layer becomes less likely to be softened, which suppresses sliding wear at a high level.

Still further, in the hard film-coated member according to a still other aspect of the present invention, it is preferable that the crystal structure of the second film layer has a single phase consisting only of a cubic rock salt type structure, or a composite phase including a cubic rock salt type structure and a hexagonal type structure mixed therein, and in the case of the composite phase, peak intensity ratio (Ih/Ic)≦1 is satisfied, where Ic denotes the cubic peak intensity which is the larger peak intensity of the peak intensities of the (111) plane and the (200) plane of the cubic crystal, and Ih denotes the hexagonal peak intensity which is the largest peak intensity of the peak intensities of the (100) plane, the (002) plane and the (101) plane of the hexagonal crystal, measured by means of an X-ray diffraction device.

With the configuration, the crystal structure of the second film layer has a single phase consisting only of a cubic rock salt type structure, or a composite phase including a cubic rock salt type structure and a hexagonal type structure mixed therein. In the case of the composite phase, the peak intensity ratio (Ih/Ic) of the cubic peak intensity (Ic) and the hexagonal peak intensity (Ih) measured by means of an X-ray diffraction device is restricted within a prescribed range. This restricts the ratio of the hexagonal crystal to be mixed with the cubic crystal. Specifically, the mixing ratio of the hexagonal crystal which is soft and reduces the wear resistance of the second film layer is reduced.

Furthermore, in the hard film-coated member according to a further aspect of the present invention, it is preferable that the crystal structure of the second film layer includes a cubic rock salt type structure, and peak intensity ratio (In/Ic)≦1 is satisfied, based on comparison with In, where Ic denotes the cubic peak intensity which is the larger peak intensity of the peak intensities of the (111) plane and the (200) plane of the cubic crystal measured by means of an X-ray diffraction device, and In denotes the peak intensity of the (110) plane of metal Nb.

With the configuration, the crystal structure of the second film layer includes a cubic rock salt type structure, and the peak intensity ratio (In/Ic) of the cubic peak intensity (Ic) measured by means of an X-ray diffraction device and the peak intensity (In) of metal Nb is restricted within a prescribed range. This restricts the amount of the metal Nb particles to be taken into the second film layer. Specifically, the amount of the metal Nb particles which are soft and reduce the wear resistance of the second film layer is reduced.

Whereas, in the hard film-coated member according to a still further aspect of the present invention, it is preferable that the second film layer is formed with a cathode discharge type arc ion plating evaporation method, and for forming the second film layer, the bias voltage of the substrate set in a device for use in the cathode discharge type arc ion plating evaporation method is −30 to −200 V.

With the configuration, for forming the second film layer, the bias voltage of the substrate is within the prescribed range. This restricts the peak intensity ratio (Ih/Ic) of the cubic peak intensity (Ic) and the hexagonal peak intensity (Ih) of the second film layer measured by an X-ray diffraction device within the prescribed range. Thus, the ratio of the hexagonal crystal in the second film layer is reduced.

Further, in the hard film-coated member according to a still other aspect of the present invention, it is preferable that the second film layer is formed with a cathode discharge type arc ion plating evaporation method, and for forming the second film layer, the nitrogen pressure in a device for use in the cathode discharge type arc ion plating evaporation method is 2 to 10 Pa.

With the configuration, for forming the second film layer, the nitrogen pressure in the device is within the prescribed range. This restricts the peak intensity ratio (In/Ic) of the cubic peak intensity (Ic) and the hexagonal peak intensity (Ih) of the second film layer measured by an X-ray diffraction device within the prescribed range. Thus, the amount of the metal Nb particles to be taken into the second film layer is reduced.

Further, in the hard film-coated member according to a furthermore aspect of the present invention, it is preferable that the first film layer includes CrN of $Cr_{1-a-b}M_aB_b(C_cN_{1-c})$, in which a=0, b=0, and c=0, and the second film layer includes $Nb_{1-d-e-f}Cr_dAl_eSi_fN$ of $Nb_{1-d-e-f}Cr_dAl_eL_f(C_gN_{1-g})$, in which g=0, and L is Si, and d, e, and f satisfy the following relations: 0.1≦1-d-e-f≦0.3; 0.1≦d≦0.3; 0.5≦e≦0.6; and 0.01≦f≦0.05.

With the configuration, the first film layer includes CrN. This ensures the high adhesion between the base material and the first film layer and the second film layer. Then, the second film layer includes $Nb_{1-d-e-f}Cr_dAl_eSi_fN$ having an atomic ratio within the prescribed range. This suppresses the oxidation wear of the second film layer at a high level. In addition, the second film layer becomes less likely to become softened. This suppresses the sliding wear thereof at a high level.

Still further, according to a further aspect of the present invention, the hard film-coated member preferably further includes a lamination film including a third film layer and a fourth film layer alternately stacked between the first film layer and the second film layer, wherein the third film layer includes $Cr_{1-b}M_aB_b(C_cN_{1-c})$, and the film thickness of the third film layer is smaller than the film thickness of the first film layer, the fourth film layer includes $Nb_{1-d-e-f}Cr_dAl_eL_f(C_gN_{1-g})$, and the film thickness of the fourth film layer is smaller than the film thickness of the second film layer, and the lamination cycle of the lamination film is 300 nm or less, and the total film thickness of the lamination film is 0.05 μm or more.

With the configuration, the lamination film formed by alternately stacking the third film layer including the same $Cr_{1-a-b}M_aB_b(C_cN_{1-c})$ as that of the first film layer, and having an atomic ratio which is the same as or different from that of the first film layer, and the fourth film layer including the same $Nb_{1-d-e-f}Cr_dAl_eL_f(C_gN_{1-g})$ as that of the second film layer, and having an atomic ratio which is the same as or different from that of the second film layer is included between the first film layer and the second film layer. In addition, the lamination cycle and the total film thickness of the lamination film are within respective prescribed ranges. This suppresses peeling of the second film layer under an external stress, which improves the adhesion between the first film layer and the second film layer.

Furthermore, in the hard film-coated member according to a furthermore aspect of the present invention, it is preferable that the base material contains a Cr-containing precipitated carbide, and the Rockwell hardness of the base material is HRC50 or more.

With the configuration, the base material has a Rockwell hardness within the prescribed range. As a result, even when the base material contains a Cr-containing precipitated carbide, the difference in mechanical characteristics between the matrix of the base material and the Cr-containing precipitated carbide is minimized. Therefore, the deformation behavior of the matrix and the deformation behavior of the Cr-containing precipitated carbide under an external stress become close to each other. This suppresses the occurrence of cracks or the like at the interface between the matrix and the Cr-containing precipitated carbide. As a result, the adhesion between the base material and the first film layer is ensured.

Whereas, according to a still other aspect of the present invention, the hard film-coated member preferably further includes a diffusion layer formed by nitriding, carburizing, or carbonitriding of the base material, between the base material and the first film layer.

With the configuration, the diffusion layer is included between the base material and the first film layer. Thus, the difference in mechanical characteristics between the matrix of the base material and the Cr-containing precipitated carbide is minimized. Therefore, the deformation behavior of the matrix and the deformation behavior of the Cr-containing precipitated carbide under an external stress become close to each other. This still more suppresses the occurrence of cracks or the like at the interface between the matrix and the Cr-containing precipitated carbide. As a result, the adhesion between the base material and the first film layer is still more ensured.

According to another aspect of the invention, there is provided a jig for molding, which includes the hard film-coated member.

With the configuration, the jig for molding has the hard film coated member. As a result, the wear resistance and the adhesion of the jig for molding are improved.

DETAILED DESCRIPTION OF THE PREFERRED EMBODIMENTS

The hard film-coated member in accordance with the present invention is excellent in wear resistance and adhesion, and can be preferably used as a member of a jig for molding such as a die, which is improved in durability thereby. Further, the jig for molding in accordance with the present invention is excellent in wear resistance and adhesion, and can be preferably used as a member of a jig for molding such as a die, which is improved in durability thereby.

Figure 1A:
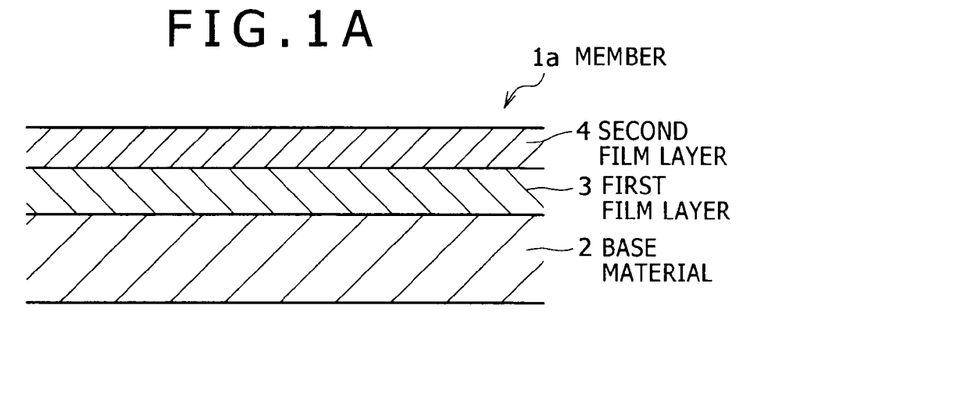
FIGS. 1A to 1C are cross sectional views each showing a configuration of a hard film-coated member in accordance with the present invention.
Figure 1B:
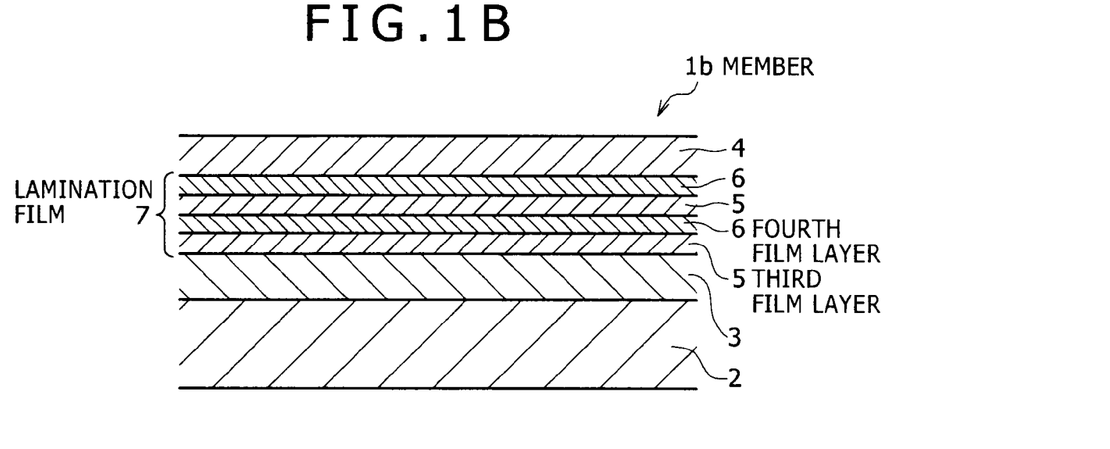
Figure 1C:
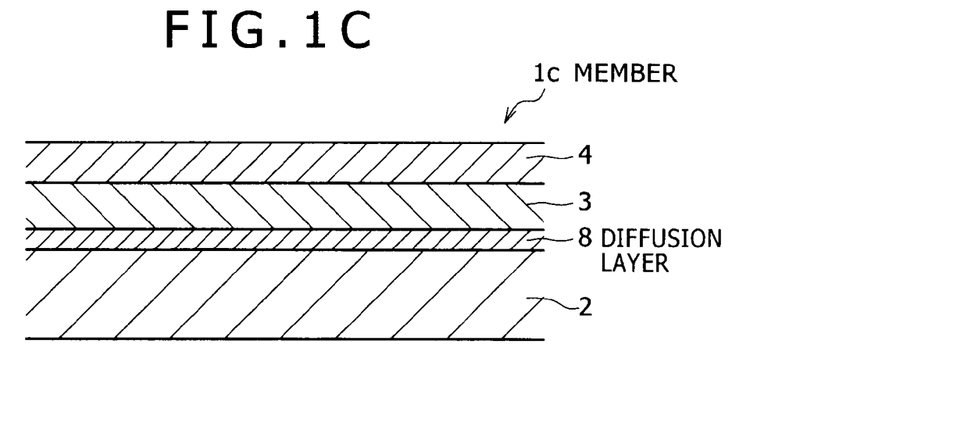

Embodiments of the hard film-coated member (member) in accordance with the present invention will be described in details by reference to the accompanying drawings. FIGS. 1A to 1C are each a cross sectional view showing a configuration of the hard film-coated material.

As shown in FIG. 1A, a hard film-coated material 1a includes a base material 2, a first film layer 3 formed on the surface of the base material 2, and a second film layer 4 formed on the surface of the first film layer 3.

Incidentally, FIG. 1A shows the configuration including the first film layer 3 and the second film layer 4 on one side of the base material 2. However, a configuration including the first film layer 3 and the second film layer 4 on opposite sides of the base material 2 is also acceptable.

(Base Material)

The base material 2 includes an iron-base alloy containing Cr. As the iron base alloy containing Cr, mention may be made of a die steel such as SKD61 or SKD11 specified in JIS, a high-speed tool steel such as SKH51, or the like. Incidentally, the Cr content is preferably about 3 mass % or more.

In the present invention, when the base material 2 contains a precipitated carbide containing Cr (which is also hereinafter referred to as a Cr-containing precipitated carbide), it is particularly effective. Herein, the Cr-containing precipitated carbide is the one containing Cr in the form of a carbide in precipitated carbides such as $M_7C_3$ (M: Fe, Cr). For the base material 2 having such a Cr-containing precipitated carbide, the matrix and the Cr-containing precipitated carbide are different in mechanical characteristics (hardness, Young's modulus) from each other. Therefore, they are different from each other in elasto-plastic deformation behavior under an external stress. For this reason, when the base material 2 has a film layer on the surface thereof, cracks occur at the interface between the Cr-containing precipitated carbide and the matrix, so that the film layer is likely to undergo peeling. However, in the present invention, the first film layer 3 having a composition such as to provide a higher hardness than that of the base material 2 described later is included. Therefore, the first film layer 3 plays a role of preventing deformation of the base material 2, so that the effect of the external stress on the base material 2 can be minimized. As a result, even when the base material 2 contains a Cr-containing precipitated carbide, the deformation of the base material 2 itself can be suppressed. This can suppress the damage on the first film layer 3 due to the difference in deformation behavior. However, when the base material 2 itself is soft, it is still affected by an external stress. For this reason, the Rockwell hardness of the base material 2 is preferably HRC50 or more, and more preferably HRC55 or more.

(First Film Layer)

The first film layer 3 includes a composition expressed by the general formula (1): $Cr_{1-a-b}M_aB_b(C_cN_{1-c})$, wherein M is one or more elements selected from W, V, Mo, Nb, Ti, and Al, and a, b, and c each denote the atomic ratio, and the following relations are satisfied:

$0 \leq a \leq 0.7$;

$0 \leq b \leq 0.15$;

$0 \leq c \leq 0.5$; and $0.3 \leq 1-a-b$.

Then, the film thickness of the first film layer 3 is 1 to 10 μm.

As shown in the general formula (1), the first film layer 3 contains Cr and N as essential elements, and contains M, B, and C as selected elements. Further, the second film layer 4 described later contains Al in an atomic ratio of 0.4 or more, and contains AlN as a nitride in an atomic ratio of 0.4 or more. The AlN is inferior in adhesion to the iron base alloy member. Therefore, in order to improve the adhesion with the base material 2 including an iron base alloy member, the first film layer 3 is disposed as the underlayer of the second film layer 4.

(1-a-b) is the atomic ratio of Cr, and is set at 0.3 or more. This is for improving the adhesion with the base material 2 including an iron base alloy containing Cr (which is also hereinafter referred to as a Cr-containing iron base alloy base material). When the atomic ratio of Cr(1-a-b) is less than 0.3, the adhesion with the Cr-containing iron base alloy base material 2 becomes insufficient. The atomic ratio of Cr(1-a-b) is preferably set at 0.4 or more.

(a) is the atomic ratio of M, and set at 0.7 or less. M is one or more selected from W, V, Mo, Nb, Ti, and Al, which may be added alone, or may be added in combination thereof. Addition of M enhances the hardness of the first film layer 3, which suppress the difference in deformation behavior under an external stress between the second film layer 4 and the base material 2. As a result, the adhesion of the second film layer 4 is improved. When the atomic ratio of M (a) (the total atomic ratio of respective elements when M's are two are more) exceeds 0.7, the atomic ratio of Cr(1-a-b) decreases, and cannot be set at 0.3 or more.

(b) is the atomic ratio of B, and is set at 0.15 or less. Addition of B enhances the hardness of the first film layer 3, so that the adhesion of the second film layer 4 is improved as with the M. When the atomic ratio of B (b) exceeds 0.15, the hardness of the first film layer 3 is insufficiently enhanced. The atomic ratio of B (b) is preferably set at 0.1 or less.

(c) is the atomic ratio of C, and is set at 0.5 or less. Addition of C enhances the hardness of the first film layer 3, so that the adhesion of the second film layer 4 is improved as with the M.

When the atomic ratio of C (c) exceeds 0.5, the hardness of the first film layer 3 is insufficiently enhanced. The atomic ratio of C (c) is preferably set at 0.3 or less.

(1-c) is the atomic ratio of N, and is set at 0.5 or more. N is the essential element for improving the adhesion of the second film layer 4 due to the enhancement of the hardness of the first film layer 3. When the atomic ratio of N(1-a) is less than 0.5, the hardness of the first film layer 3 is insufficiently enhanced.

The first film layer 3 has, in addition to the role of ensuring the adhesion between the first film layer 3 and the Cr-containing iron base alloy base material 2, a role of ensuring the adhesion of the second film layer 4 in the following manner: it has mechanical characteristics (hardness and Young's modulus) intermediate between those of the second film layer 4 and those of the Cr-containing iron base alloy base material 2; this suppresses the difference in deformation behavior under an external stress due to the difference in mechanical characteristics between the second film layer 4 and the Cr-containing iron base alloy base material 2. In order to allow such a role to be exerted, the film thickness of the first film layer 3 is required to be 1 μm or more, and more preferably 3 μm or more. However, the deformation behavior suppressing effect is saturated when the film thickness of the first film layer 3 exceeds 10 μm. For this reason, the film thickness of the first film layer 3 is set at 10 μm or less from the viewpoint of the efficiency of production.

(Second Film Layer)

The second film layer 4 includes a composition expressed by the general formula (2) $Nb_{1-d-e-f}Cr_dAl_eL_f(C_gN_{1-g})$, where L is one or more elements selected from Si, Y, and B, and d, e, f, and g each denote the atomic ratio, and the following relations are satisfied:

$0.05 \leq 1-d-e-f \leq 0.5$;

$0.05 \leq d \leq 0.5$;

$0.4 \leq e \leq 0.7$;

$0 \leq f \leq 0.15$; and $0 \leq g \leq 0.5$.

Then, the film thickness of the second film layer 4 is 2 to 10 μm.

As shown in the general formula (2), the second film layer 4 contains Nb, Cr, Al, and N as essential elements, and contains L (one or more of Si, Y, and B) and C as selected elements. Further, the second film layer 4 is a film excellent in wear resistance, and has an effect of suppressing the oxidation wear due to heat generation during molding forming, and the sliding wear with the article to be processed.

(1-d-e-f) is the atomic ratio of Nb, and is set at 0.05 to 0.5. Nb is an essential element for suppressing the oxidation wear, and improving the wear resistance of the second film layer 4. When the atomic ratio of Nb(1-d-e-f) exceeds 0.5, the Al content relatively decreases, so that the oxidation wear is not suppressed. This results in the reduction of the wear resistance. Whereas, at less than 0.05, the Al content relatively increases. Thus, the second film layer 4 is softened, so that sliding wear is not suppressed, resulting in the reduction of the wear resistance. Further, the atomic ratio of Nb is preferably within the range of 0.1 to 0.3.

(d) is the atomic ratio of Cr, and is set at 0.05 to 0.5. When the second film layer 4 contains Al alone, the second film layer 4 has a soft hexagonal crystal structure. Therefore, it is necessary to add Cr in anatomic ratio of 0.05 or more thereto, and to enhance the hardness of the second film layer 4 for suppressing the sliding wear thereof. However, when Cr is added excessively, the Al content relatively decreases, so that the oxidation wear is not suppressed. For this reason, the amount of Cr to be added is set at 0.5 or less in terms of atomic ratio (d). Further, the atomic ratio of Cr (d) is preferably set at 0.1 to 0.3.

(e) is the atomic ratio of Al, and is set at 0.4 to 0.7. Al is an essential element for imparting the wear resistance to the second film layer 4. When the Al atomic ratio (e) is less than 0.4, the oxidation wear of the second film layer 4 is not suppressed. Thus, the wear resistance becomes insufficient. Whereas, when the Al content increases, the second film layer 4 becomes softened. Thus, the sliding wear is not suppressed, so that the wear resistance is degraded. For this reason, the atomic ratio of Al (e) is set at 0.7 or less. The atomic ratio of Al (e) is preferably set at 0.5 to 0.6.

(f) is the atomic ratio of L, and is set at 0.15 or less. L is an element to be added for suppressing the oxidation wear, and further improving the wear resistance of the second film layer 4. L is one or more selected from Si, Y, and B, and may be added alone, or may be added in combination thereof. When L is added excessively, the hardness of the second film layer 4 is reduced. Therefore, the atomic ratio of L (f) (the total atomic ratio of respective elements when L's are two or more) is set at 0.15 or less. The atomic ratio of L (f) is preferably set at 0.1 or less, and further preferably set at 0.05 or less. Further, the atomic ratio of L (f) is preferably 0.01 or more in order to allow the effect to be sufficiently exerted.

(g) is the atomic ratio of C, and is set at 0.5 or less. Addition of C enhances the hardness of the second film layer 4, so that the sliding wear is suppressed. Thus, the wear resistance is improved. When the atomic ratio of C (c) exceeds 0.5, the hardness of the second film layer 4 is insufficiently enhanced. The atomic ratio of C (c) is preferably set at 0.3 or less.

(1-g) is the atomic ratio of N, and is set at 0.5 or more. N is an essential element for enhancing the hardness, and improving the wear resistance of the second film layer 4. When the atomic ratio of N(1-g) is less than 0.5, the hardness of the second film layer 4 is insufficiently enhanced. Thus, the sliding wear is not suppressed, resulting in degradation of the wear resistance.

The film thickness of the second film layer 4 has a role of keeping the wear resistance of the second film layer 4. Therefore, the film thickness of the second film layer 4 is required to be set at 2 μm or more, and more preferably at 3 μm or more. However, when the film thickness of the second film layer 4 is more than 10 μm, the film stress becomes too large. Thus, peeling of the second film layer 4 becomes more likely to occur. For this reason, the film thickness of the second film layer is set at 10 μm or less.

Then, a description will be given to a preferred embodiment of the hard film-coated member in accordance with the present invention.

The hard film-coated member 1a preferably has the first film layer 3 and the second film layer 4 with the following configuration. The same applies to the base material 2, and hence a description thereon will be omitted.

(First Film Layer)

The first film layer 3 includes CrN. This is expressed as the general formula (1): $Cr_{1-a-b}M_aB_b(C_cN_{1-c})$, where the atomic ratio of M(a), the atomic ratio of B(b), and the atomic ratio of C(c) are set at 0, and the atomic ratio of Cr(1-a-b) and the atomic ratio of N(1-c) are set at 1. Thus, the first film layer 3 is limited to CrN, so that the high adhesion with the base material 2 is ensured. Further, the film thickness of the first film layer 3 is 1 to 10 μm as with the foregoing description.

(Second Film Layer)

The second film layer 4 includes a composition expressed by the general formula (3): $Nb_{1-d-e}Cr_dAl_eN$, in which $0.1 \leq 1-d-e \leq 0.3$;

$0.1 \leq d \leq 0.3$; and $0.5 \leq e \leq 0.6$, are satisfied.

Whereas, the film thickness of the second film layer 4 is 2 to 10 μm as with the foregoing description.

The general formula (3) is the general formula (2): $Nb_{1-d-e-f}Cr_dAl_eL_f(C_gN_{1-g})$, where the atomic ratio of L (one or more selected from Si, Y, and B) (f), and the atomic ratio of C(g) are set at 0, the atomic ratio of Nb(1-d-e-f) and the atomic ratio of Cr(d) are set at 0.1 to 0.3, the atomic ratio of Al(e) is set at 0.5 to 0.6, and the atomic ratio of N(1-g) is set at 1. By restricting the atomic ratios of Nb, Cr, Al, and N in the second film layer 4 within the narrow ranges, the oxidation wear of the second film layer 4 is suppressed at a high level, and softening (sliding wear) of the second film layer 4 is suppressed at a high level.

The second film layer 4 having the composition ($Nb_{1-d-e}Cr_dAl_eN$) has its crystal structure with a single phase including only a cubic rock salt type structure, or a composite phase including a cubic rock salt type structure and a hexagonal type structure mixed therein. Then, the hexagonal component is softer than the cubic component. Therefore, due to the inclusion of the hexagonal component, the sliding wear of the second film layer 4 is not suppressed, so that the wear resistance tends to be reduced. Therefore, in the case of the composite phase, it is preferable to specify the content of the hexagonal component in the crystal structure.

Incidentally, when a hexagonal component is contained in the crystal structure, diffraction lines from (100), (002) and (101) planes are observed in the diffraction pattern measured by an X-ray diffraction device. Whereas, when a cubic component is contained in the crystal structure, diffraction lines are observed on the (111) plane and the (200) plane. Then, the peak intensity of the diffraction line is proportional to the content of each component (cubic component or hexagonal component) in the crystal structure.

Therefore, in the present invention, when the crystal structure has the composite phase, the peak intensity ratio (Ih/Ic) $\leq 1$ is preferably satisfied, where Ic denotes the cubic peak intensity which is the larger peak intensity of the peak intensities of the (111) plane and the (200) plane of the cubic crystal, and Ih denotes the hexagonal peak intensity which is the largest peak intensity of the peak intensities of the (100) plane, the (002) plane and the (101) plane measured by means of an X-ray diffraction device. More preferably, peak intensity ratio (Ih/Ic)$\leq 0.5$. When peak intensity ratio (Ih/Ic)>1, the hexagonal components in the crystal structure increases in amount, so that the wear resistance is unfavorably reduced. The second film layer 4 has a peak intensity ratio (Ih/Ic)$\leq 1$, so that the ratios of the hexagonal components and the cubic components in the crystal structure become proper, resulting in excellent wear resistance.

Figure 2:
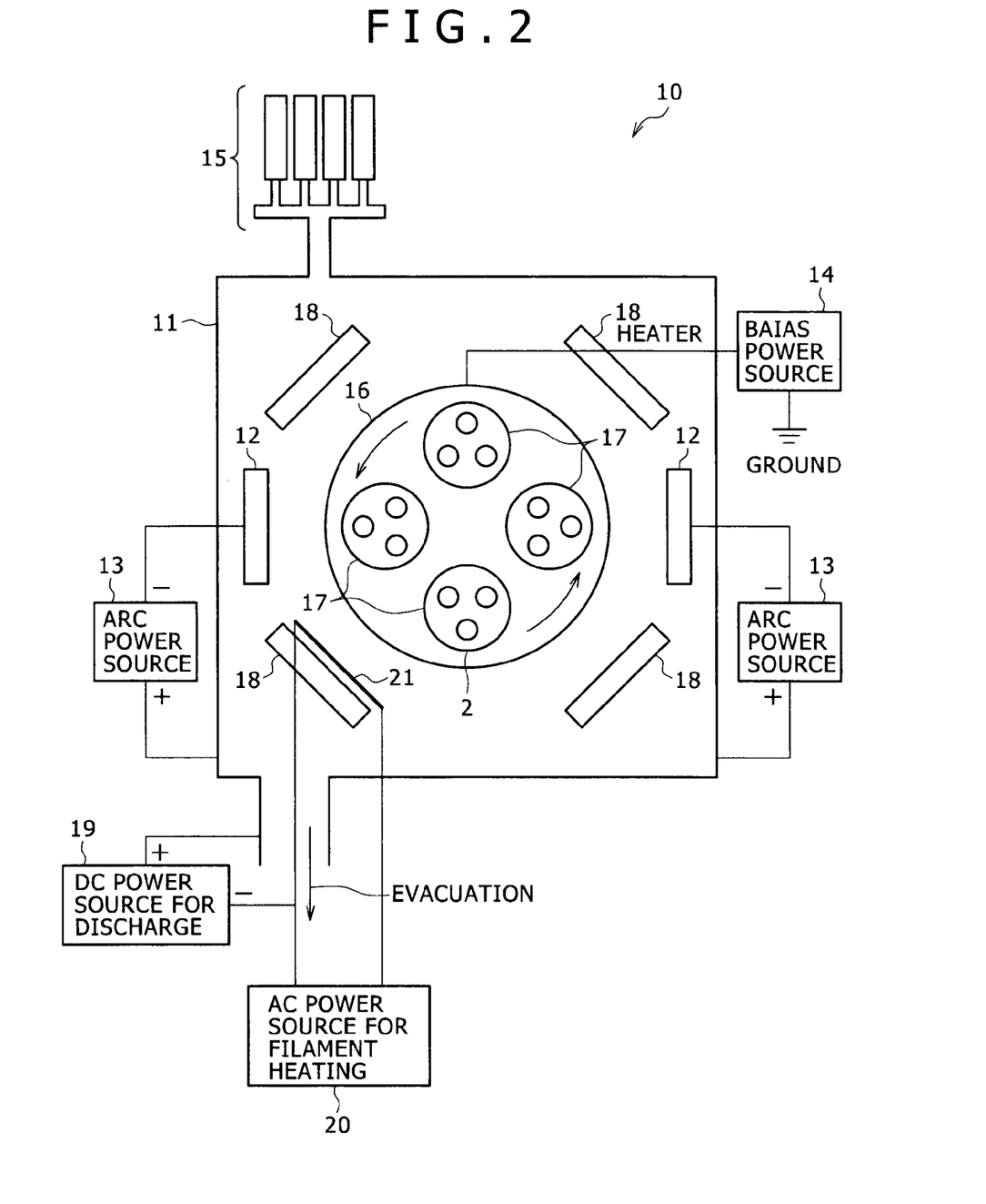
FIG. 2 is a schematic view of a deposition device.

The peak intensity ratio of the second film layer 4 (Ih/Ic) $\leq 1$ is achieved by controlling the conditions for formation of the second film layer 4. Specifically, when the second film layer 4 is formed with a cathode discharge type arc ion plating evaporation method, the device (deposition device 10) as shown in FIG. 2 is used, and the bias voltage of the base material 2 set in the device (deposition device 10) is controlled at −30 to −200 V. Whereas, the bias voltage is preferably −50 to −100 V. When the bias voltage exceeds −200 V, the energy of ions made incident during deposition of the second film layer 4 is large, and the temperature rise of the base material 2 becomes remarkable. Thus, precedence is given to etching than film formation (deposition). Thus, unfavorably, the film thickness of the second film layer 4 becomes very thin. Whereas, when the bias voltage is less than −30V, undesirably, the hexagonal components in the crystal structure increases in amount.

Whereas, for the second film layer 4, particles of metal Nb which is a refractory metal, and is less likely to evaporate may be taken into the second film layer 4. The metal Nb particles are soft. Therefore, due to the inclusion of the metal Nb in the second film layer 4, the sliding wear of the second film layer 4 is not suppressed, so that the wear resistance tends to be reduced. For this reason, it is preferable to specify the amount of the metal Nb particles to be contained in the second film layer 4. Then, the content of the metal Nb particles is, as with the content of the hexagonal components, proportional to the peak intensity of the diffraction line observed for the (110) plane in the diffraction pattern measured by means of an X-ray diffraction device.

Therefore, as described above, the crystal structure of the second film layer 4 including the cubic rock salt structure preferably satisfies the peak intensity ratio (In/Ic)$\leq 1$, based on comparison with In, where Ic denotes the cubic peak intensity which is the larger peak intensity of the peak intensities of the (111) plane and the (200) plane of the cubic crystal measured by means of an X-ray diffraction device, and In denotes the peak intensity of the (110) plane of the metal Nb. More preferably, the peak intensity ratio (In/Ic)$\leq 0.5$. At a peak intensity ratio (In/Ic) of more than 1, the amount of the metal Nb particles taken in the second film layer 4 increases, unfavorably resulting in degradation of the wear resistance. The second film layer 4 has a peak intensity ratio (In/Ic) of equal to, or more than 1. This results in reduction of the amount of the metal Nb particles to be taken into the second film layer 4. Thus, excellent surface smoothness and excellent wear resistance can be obtained.

The peak intensity ratio of the second film layer 4 (In/Ic) $\leq 1$ is achieved by controlling the conditions for formation of the second film layer 4. Specifically, when the second film layer 4 is formed with a cathode discharge type arc ion plating evaporation method using the device (deposition device 10) as shown in FIG. 2, a NbCrAl target is used as a target (evaporation source) 12. Therefore, the metal Nb particles scatter from the target 12 according to the formation conditions, and are taken into the second film layer 4 formed on the base material 2. Then, scattering of the metal Nb particles from the target 12 is strongly affected by the nitrogen pressure in the device (deposition device 10).

In the present invention, the following was found out. The nitrogen pressure in the device (deposition device 10) is set at 2 Pa or more. This results in less scattering of the metal Nb particles, which reduces the amount of the metal Nb particles to be taken into the second film layer 4. As a result, the peak intensity ratio of the second film layer 4 (In/Ic)$\leq 1$ can be achieved. The nitrogen pressure is preferably 2 Pa or more, and more preferably 4 Pa or more. However, when the nitrogen pressure exceeds 10 Pa, the amount of the metal Nb particles to be taken into the second film layer 4 is reduced, but the formation rate of the second film layer 4 decreases. This unfavorably results in a very small film thickness of the second film layer 4. Further, the nitrogen pressure is more preferably 8 Pa or less.

Further, the hard film-coated member 1a preferably has the first film layer 3 and the second film layer 4 with the following configurations. The same applies to the base material 2, and a description thereon will be omitted.

(First Film Layer)

The first film layer 3 includes CrN. This is expressed by the general formula (1): $Cr_{1-a-b}M_aB_b(C_cN_{1-c})$, where the atomic ratio of M(a), the atomic ratio of B(b), and the atomic ratio of C(c) are set at 0, and the atomic ratio of Cr(1-a-b) and the atomic ratio of N(1-c) are set at 1. By thus restricting the first film layer 3 to CrN, the high adhesion with the base material 2 is ensured. Further, the film thickness of the first film layer 3 is 1 to 10 μm as with the foregoing description.

(Second Film Layer)

The second film layer 4 includes a composition expressed by the general formula (4) $Nb_{1-d-e-f}Cr_dAl_eSi_fN$, in which $0.1 \leq 1-d-e-f \leq 0.3$;

$0.1 \leq d \leq 0.3$;

$0.5 \leq e \leq 0.6$; and $0.01 \leq f \leq 0.05$, are satisfied.

Then, the film thickness of the second film layer 4 is 2 to 10 μm as with the foregoing description.

The general formula (4) corresponds to the general formula (2) $Nb_{1-d-e-f}Cr_dAl_eL_f(C_gN_{1-g})$, where the atomic ratio of C(g) is set at 0, the atomic ratio of Nb(1-d-e-f) and the atomic ratio of Cr(d) are set at 0.1 to 0.3, the atomic ratio of Al(e) is set at 0.5 to 0.6, L is limited to Si, and the atomic ratio (f) is set at 0.01 to 0.05, and the atomic ratio of N(1-g) is set at 1. By restricting the atomic ratios of Nb, Cr, Al, Si, and N in the second film layer 4 within the narrow ranges, the oxidation wear of the second film layer 4 is suppressed at a high level, and softening (sliding wear) of the second film layer 4 is suppressed at a high level.

Then, a description will be given to another embodiment of the hard film-coated member in accordance with the present invention.

As shown in FIG. 1B, the hard film-coated member 1b has a lamination film 7 between the first film layer 3 formed on the surface of the base material 2 and the second film layer 4.

The lamination film 7 is included between the first film layer 3 and the second film layer 4. This can enhance the adhesion between the first film layer 3 and the second film layer 4, which can suppress peeling of the first film layer 3 and the second film layer 4 under an external stress. As a result, the adhesion therebetween is improved.

Herein, the base material 2, the first film layer 3, and the second film layer 4 are the same as those of the hard film-coated member 1a, and hence a description thereon will be omitted. Below, the lamination film 7 will be described.

(Lamination Film)

The lamination film 7 is formed by alternately staking a third film layer 5 and a fourth film layer 6. Then, the third film layer 5 includes the same composition $Cr_{1-a-b}M_aB_b(C_cN_{1-c})$ as that of the first film layer 3. The third film layer 5 has an atomic ratio which is the same as or different from that of the first film layer 3, and has a smaller film thickness than that of the first film layer 3. Whereas, the fourth film layer 6 includes the same composition $Nb_{1-d-e-f}Cr_dAl_eL_f(C_gN_{1-g})$ as that of the second film layer 4. The fourth film layer 6 has an atomic ratio which is the same as or different from that of the second film layer 4, and has a smaller film thickness than that of the second film layer 4.

The lamination film 7 has a lamination cycle of 300 nm or less, and more preferably 100 nm or less. Herein, the lamination cycle means the film thickness of the lamination film 7 when one third film layer 3 and one fourth film layer 6 are stacked. When the lamination cycle is more than 300 nm, the improvement effect of the adhesion between the first film layer 3 and the second film layer 4 cannot be obtained.

The lamination film 7 has a total film thickness of 0.05 μm or more, and more preferably 0.2 μm or more. When the total film thickness is less than 0.05 μm, peeling of the first film layer 3 and the second film layer 4 cannot be suppressed under an external stress. However, even when the total film thickness exceeds 5 μm, the improvement effect of the adhesion between the first film layer 3 and the second film layer 4 does not differ from that in the case of 5 μm less. For this reason, the total film thickness is preferably 5 μm less in consideration of efficiency of production.

As shown in FIG. 1C, the hard film-coated member 1c further includes a diffusion layer 8 between the base material 2 and the first film layer 3 of the hard film-coated member 1a or 1b (see FIGS. 1A and 1B). Then, the base material 2 contains a Cr-containing precipitated carbide. Incidentally, the base material 2, the first film layer 3, the second film layer 4, the third film layer 5, and the fourth film layer 6 are the same as with the foregoing description. Therefore, a description thereon will be omitted.

(Diffusion Layer)

The diffusion layer 8 is formed by nitriding, carburizing, or carbonitriding the base material 2. Then, the matrix part of the base material 2 is hardened by formation of the diffusion layer 8. Therefore, the surface hardness of the base material 2 is increased. This minimizes the difference in mechanical characteristics between the Cr-precipitated carbide and the matrix of the base material 2. Thus, the deformation of the base material 2 (peeling of the first film layer 3) under an external stress is suppressed, so that the adhesion between the base material 2 and the first film layer 3 is improved. Further, for nitriding, carburizing, or carbonitriding, a treatment method using a plasma is preferable. The depth of the diffusion layer 8 is preferably 10 μm or more. Whereas, when the hard film-coated member 1c is used for a part to be applied with a load, the external stress affects the deep part of the base material 2. Therefore, the depth of the diffusion layer 8 is more preferably 50 μm or more. When the load is further higher, the depth of the diffusion layer 8 is required to be 100 μm or more.

For each of the hard film-coated members 1a, 1b, and 1c, the first film layer 3, the second film layer 4, and the lamination film 7 (the third film layer 5 and the fourth film layer 6) are preferably formed with an arc ion plating evaporation method. However, they may be formed with an unbalanced magnetron sputtering evaporation method. Further, as the deposition device using the arc ion plating evaporation method, for example, the following deposition device is used. FIG. 2 is a schematic view of the deposition device.

As shown in FIG. 2, the deposition device 10 includes a chamber 11 having an exhaust port for evacuation, and a gas supply port 15 for supplying a deposition gas and an inert gas, an arc power source 13 connected to an arc type evaporation source 12, support bases 17 on a substrate stage 16 for supporting to-be-treated articles (base materials 2), and a bias power source 14 for applying a negative bias voltage to the to-be-treated articles through the support bases 17 between the support bases 17 and the chamber 11. Further, the deposition device 10 has a heater 18, a DC power source for discharge 19, an AC power source for filament heating 20, a filament 21, and the like. For carrying out the present invention, as the gas to be supplied from the gas supply port 15 into the chamber 11, there are used deposition gases of nitrogen ($N_2$), methane ($CH_4$), and the like in accordance with the deposition components (composition of the film layer), and a mixed gas of these and an inert gas of argon or the like.

Then, a description will be given to the jig for molding in accordance with the present invention.

Although the jig for molding is not shown, it has the hard film-coated member 1a, 1b, or 1c. The jig for molding has the hard film-coated member 1a, 1b, or 1c, and hence is excellent in wear resistance and adhesion. Thus, the jig for molding can be preferably used as a jig for molding such as a die, of which the durability is improved. Whereas, as the dies, mention may be made of plastic working dies such as press dies and forging dies, shear dies such as blanking punches, trim dies, die casting dies, or the like.

EXAMPLES

Examples and Comparative Examples of the present invention will be described below. Incidentally, the present invention is not limited to the Examples. Changes may be made and carried out within the scope adaptable to the gist of the present invention, all of which are included within the technical scope of the present invention.

Example 1

By means of the deposition device having a plurality of arc evaporation sources (see FIG. 2), the film layers of the compositions shown in Tables 1 to 3 were manufactured. Incidentally, as the base material, a SKD11 substrate (which had been heat treated to have a hardness of HRC60) was used.

Each base material shown in Tables 1 to 3 was introduced into the chamber of the deposition device, and the inside of the chamber was evacuated (evacuated to $1\times10^{-3}$ Pa or less). Then, the base material was heated up to about 400° C. Thereafter, sputter cleaning was carried out with Ar ions. Then, using a 100 mm-dia target (evaporation source), deposition was carried out at an arc current of 150 A, in an atmosphere of $N_2$ or a mixed gas of $N_2+CH_4$ with a total pressure of 4 Pa. The bias to be applied to the base material was −70 V. For the deposition, first, a first film layer was formed on the base material (substrate) using a target having the composition of the first film layer. Then, the evaporation source was switched, and by a target having the composition of the second film layer, a second film layer was formed on the first film layer.

For the samples in each of which the film layers were formed in this manner, the composition, hardness, adhesion, and wear depth (wear resistance) of each film layer were measured. The results are shown in Tables 1 to 3.

At this step, the composition of each film layer was measured with EPMA. The adhesion of the film layer was evaluated by pressing a diamond indenter with a tip radius of 200 µm R on the sample surface, and performing a scratch test described later. The hardness of the film layer was measured under the conditions of a measurement load of 0.25 N and a measurement time of 15 seconds by means of a micro-Vickers hardness meter. The wear depth of the film layer was evaluated with a sliding test under a high temperature described later.

Whereas, the oxidation start temperature of the second film layer was measured by means of a thermobalance using a sample in which only the second film layer had been separately formed on platinum. While increasing the temperature at a rate of 4° C./min in a dry air, the oxidation weight increase was measured. Thus, the temperature at which a sharp oxidation weight increase has been observed is defined as the oxidation start temperature.

(Scratch Test)
  Indenter: diamond (tip radius 200 µm R)
  Scratch rate: 10 mm/min
  Load increase rate: 100 N/min
  Scratch distance: 20 mm (0 to 200 N)
  Evaluation criteria (adhesion evaluation criteria): 100 N or more is rated as success (Sliding Test Under High Temperature)
  Device: Vane-on-disk type sliding tester
  Vane: SKD61 (HRC50)
  Disk: SKD11 (HRC60) with a film formed thereon
  Sliding speed: 0.2 m/sec
  Load: 500 N
  Sliding distance: 2000 m
  Test temperature: 500° C.
  Evaluation criteria: Wear resistance of 4 µm or less is rated as success

TABLE 1

| | No. | Base material | First film layer Composition (atomic ratio) | | | | | | First film Film thickness (µm) | Second film layer Composition (atomic ratio) | | | | | | | | Second Film thickness (µm) |
|---|---|---|---|---|---|---|---|---|---|---|---|---|---|---|---|---|---|---|
| | | | Cr | M Kind | M Content | B | C | N | | Nb | Cr | Al | Si | Y | B | C | N | |
| Comparative | 1 | SKD11 | | No first film layer | | | | | 0 | 1 | 0 | 0 | 0 | 0 | 0 | 0 | 1 | 10 |
| Example | 2 | SKD11 | | No first film layer | | | | | 0 | 0.2 | 0.2 | 0.6 | 0 | 0 | 0 | 0 | 1 | 10 |
| | 3 | SKD11 | 1 | | 0 | 0 | 0 | 1 | 0.5 | 0.2 | 0.2 | 0.6 | 0 | 0 | 0 | 0 | 1 | 5 |
| Example | 4 | SKD11 | 1 | | 0 | 0 | 0 | 1 | 1 | 0.2 | 0.2 | 0.6 | 0 | 0 | 0 | 0 | 1 | 5 |
| | 5 | SKD11 | 1 | | 0 | 0 | 0 | 1 | 3 | 0.2 | 0.2 | 0.6 | 0 | 0 | 0 | 0 | 1 | 5 |
| | 6 | SKD11 | 1 | | 0 | 0 | 0 | 1 | 5 | 0.2 | 0.2 | 0.6 | 0 | 0 | 0 | 0 | 1 | 5 |
| | 7 | SKD11 | 1 | | 0 | 0 | 0 | 1 | 7 | 0.2 | 0.2 | 0.6 | 0 | 0 | 0 | 0 | 1 | 5 |
| | 8 | SKD11 | 1 | | 0 | 0 | 0 | 1 | 10 | 0.2 | 0.2 | 0.6 | 0 | 0 | 0 | 0 | 1 | 5 |
| Comparative | 9 | SKD11 | 1 | | 0 | 0 | 0 | 1 | 5 | | No second film layer | | | | | | | 0 |
| Example | 10 | SKD11 | 1 | | 0 | 0 | 0 | 1 | 5 | 0.2 | 0.2 | 0.6 | 0 | 0 | 0 | 0 | 1 | 1 |
| Example | 11 | SKD11 | 1 | | 0 | 0 | 0 | 1 | 5 | 0.2 | 0.2 | 0.6 | 0 | 0 | 0 | 0 | 1 | 2 |
| | 12 | SKD11 | 1 | | 0 | 0 | 0 | 1 | 5 | 0.2 | 0.2 | 0.6 | 0 | 0 | 0 | 0 | 1 | 3 |
| | 13 | SKD11 | 1 | | 0 | 0 | 0 | 1 | 5 | 0.2 | 0.2 | 0.6 | 0 | 0 | 0 | 0 | 1 | 5 |
| | 14 | SKD11 | 1 | | 0 | 0 | 0 | 1 | 5 | 0.2 | 0.2 | 0.6 | 0 | 0 | 0 | 0 | 1 | 10 |
| | 15 | SKD11 | 0.9 | W | 0.1 | 0 | 0 | 1 | 5 | 0.2 | 0.2 | 0.6 | 0 | 0 | 0 | 0 | 1 | 5 |
| | 16 | SKD11 | 0.8 | W | 0.2 | 0 | 0 | 1 | 5 | 0.2 | 0.2 | 0.6 | 0 | 0 | 0 | 0 | 1 | 5 |
| | 17 | SKD11 | 0.5 | W | 0.5 | 0 | 0 | 1 | 5 | 0.2 | 0.2 | 0.6 | 0 | 0 | 0 | 0 | 1 | 5 |
| | 18 | SKD11 | 0.3 | W | 0.7 | 0 | 0 | 1 | 5 | 0.2 | 0.2 | 0.6 | 0 | 0 | 0 | 0 | 1 | 5 |

TABLE 1-continued

| | No. | Base material | Cr | Kind | Content | B | C | N | (film thickness) | Nb | Cr | Al | Si | Y | B | C | N | (film thickness) |
|---|---|---|---|---|---|---|---|---|---|---|---|---|---|---|---|---|---|---|
| Comparative Example | 19 | SKD11 | 0.1 | W | 0.9 | 0 | 0 | 1 | 5 | 0.2 | 0.2 | 0.6 | 0 | 0 | 0 | 0 | 1 | 5 |
| Example | 20 | SKD11 | 0.6 | V | 0.4 | 0 | 0 | 1 | 5 | 0.2 | 0.2 | 0.6 | 0 | 0 | 0 | 0 | 1 | 5 |
| | 21 | SKD11 | 0.7 | Mo | 0.3 | 0 | 0 | 1 | 5 | 0.2 | 0.2 | 0.6 | 0 | 0 | 0 | 0 | 1 | 5 |
| | 22 | SKD11 | 0.9 | Nb | 0.1 | 0 | 0 | 1 | 5 | 0.2 | 0.2 | 0.6 | 0 | 0 | 0 | 0 | 1 | 5 |
| | 23 | SKD11 | 0.5 | Ti | 0.5 | 0 | 0 | 1 | 5 | 0.2 | 0.2 | 0.6 | 0 | 0 | 0 | 0 | 1 | 5 |
| | 24 | SKD11 | 0.4 | Al | 0.6 | 0 | 0 | 1 | 5 | 0.2 | 0.2 | 0.6 | 0 | 0 | 0 | 0 | 1 | 5 |
| | 25 | SKD11 | 0.9 | | 0 | 0.1 | 0 | 1 | 5 | 0.2 | 0.2 | 0.6 | 0 | 0 | 0 | 0 | 1 | 5 |
| | 26 | SKD11 | 0.8 | | 0 | 0.15 | 0 | 1 | 5 | 0.2 | 0.2 | 0.6 | 0 | 0 | 0 | 0 | 1 | 5 |
| Comparative Example | 27 | SKD11 | 0.7 | | 0 | 0.3 | 0 | 1 | 5 | 0.2 | 0.2 | 0.6 | 0 | 0 | 0 | 0 | 1 | 5 |

| | No. | Adhesion (N) | Film layer hardness (GPa) | Oxidation start temperature (°C.) | Wear depth (μm) |
|---|---|---|---|---|---|
| Comparative Example | 1 | 50 | 22 | 550 | More |
| | 2 | 60 | 33 | 1150 | 5 |
| | 3 | 80 | 33 | 1150 | 4.5 |
| Example | 4 | 140 | 33 | 1150 | 2.7 |
| | 5 | 140 | 33 | 1150 | 1.5 |
| | 6 | 160 | 33 | 1150 | 0.5 |
| | 7 | 160 | 33 | 1150 | 0.6 |
| | 8 | 160 | 33 | 1150 | 1.2 |
| Comparative Example | 9 | 160 | 33 | 1150 | More |
| | 10 | 160 | 33 | 1150 | 5 |
| Example | 11 | 160 | 33 | 1150 | 2.5 |
| | 12 | 160 | 33 | 1150 | 1.5 |
| | 13 | 160 | 33 | 1150 | 0.5 |
| | 14 | 160 | 33 | 1150 | 0.4 |
| | 15 | 160 | 33 | 1150 | 1.2 |
| | 16 | 160 | 33 | 1150 | 1 |
| | 17 | 140 | 33 | 1150 | 1.1 |
| | 18 | 120 | 33 | 1150 | 2.3 |
| Comparative Example | 19 | 80 | 33 | 1150 | 6.7 |
| Example | 20 | 140 | 33 | 1150 | 1.1 |
| | 21 | 130 | 33 | 1150 | 1.1 |
| | 22 | 120 | 33 | 1150 | 1.2 |
| | 23 | 135 | 33 | 1150 | 2.8 |
| | 24 | 140 | 33 | 1150 | 2 |
| | 25 | 140 | 33 | 1150 | 1.3 |
| | 26 | 130 | 33 | 1150 | 1.5 |
| Comparative Example | 27 | 80 | 33 | 1150 | 5 |

TABLE 2

| | | | First film layer | | | | | | Second film layer | | | | | | | | |
|---|---|---|---|---|---|---|---|---|---|---|---|---|---|---|---|---|---|---|
| | | | Composition (atomic ratio) | | | | | | Film thickness | Composition (atomic ratio) | | | | | | | | Film thickness |
| | | | | M | | | | | | | | | L | | | | | |
| | No. | Base material | Cr | Kind | Content | B | C | N | (μm) | Nb | Cr | Al | Si | Y | B | C | N | (μm) |
| Example | 28 | SKD11 | 1 | | 0 | 0 | 0.1 | 0.9 | 5 | 0.2 | 0.2 | 0.6 | 0 | 0 | 0 | 0 | 1 | 5 |
| | 29 | SKD11 | 1 | | 0 | 0 | 0.4 | 0.6 | 5 | 0.2 | 0.2 | 0.6 | 0 | 0 | 0 | 0 | 1 | 5 |
| Comparative Example | 30 | SKD11 | 1 | | 0 | 0 | 0.6 | 0.4 | 5 | 0.2 | 0.2 | 0.6 | 0 | 0 | 0 | 0 | 1 | 5 |
| Example | 31 | SKD11 | 1 | | 0 | 0 | 0 | 1 | 5 | 0 | 0.4 | 0.6 | 0 | 0 | 0 | 0 | 1 | 5 |
| Example | 32 | SKD11 | 1 | | 0 | 0 | 0 | 1 | 5 | 0.05 | 0.35 | 0.6 | 0 | 0 | 0 | 0 | 1 | 5 |
| | 33 | SKD11 | 1 | | 0 | 0 | 0 | 1 | 5 | 0.1 | 0.3 | 0.6 | 0 | 0 | 0 | 0 | 1 | 5 |
| | 34 | SKD11 | 1 | | 0 | 0 | 0 | 1 | 5 | 0.3 | 0.1 | 0.6 | 0 | 0 | 0 | 0 | 1 | 5 |
| | 35 | SKD11 | 1 | | 0 | 0 | 0 | 1 | 5 | 0.4 | 0.1 | 0.5 | 0 | 0 | 0 | 0 | 1 | 5 |
| | 36 | SKD11 | 1 | | 0 | 0 | 0 | 1 | 5 | 0.5 | 0.1 | 0.4 | 0 | 0 | 0 | 0 | 1 | 5 |
| Comparative Example | 37 | SKD11 | 1 | | 0 | 0 | 0 | 1 | 5 | 0.7 | 0.1 | 0.2 | 0 | 0 | 0 | 0 | 1 | 5 |
| Example | 38 | SKD11 | 1 | | 0 | 0 | 0 | 1 | 5 | 0.4 | 0 | 0.6 | 0 | 0 | 0 | 0 | 1 | 5 |
| Example | 39 | SKD11 | 1 | | 0 | 0 | 0 | 1 | 5 | 0.35 | 0.05 | 0.6 | 0 | 0 | 0 | 0 | 1 | 5 |
| | 40 | SKD11 | 1 | | 0 | 0 | 0 | 1 | 5 | 0.3 | 0.1 | 0.6 | 0 | 0 | 0 | 0 | 1 | 5 |
| | 41 | SKD11 | 1 | | 0 | 0 | 0 | 1 | 5 | 0.1 | 0.3 | 0.6 | 0 | 0 | 0 | 0 | 1 | 5 |
| | 42 | SKD11 | 1 | | 0 | 0 | 0 | 1 | 5 | 0.1 | 0.5 | 0.4 | 0 | 0 | 0 | 0 | 1 | 5 |
| Comparative Example | 43 | SKD11 | 1 | | 0 | 0 | 0 | 1 | 5 | 0.1 | 0.6 | 0.3 | 0 | 0 | 0 | 0 | 1 | 5 |
| Example | 44 | SKD11 | 1 | | 0 | 0 | 0 | 1 | 5 | 0.35 | 0.35 | 0.3 | 0 | 0 | 0 | 0 | 1 | 5 |
| Example | 45 | SKD11 | 1 | | 0 | 0 | 0 | 1 | 5 | 0.3 | 0.3 | 0.4 | 0 | 0 | 0 | 0 | 1 | 5 |
| | 46 | SKD11 | 1 | | 0 | 0 | 0 | 1 | 5 | 0.25 | 0.25 | 0.5 | 0 | 0 | 0 | 0 | 1 | 5 |
| | 47 | SKD11 | 1 | | 0 | 0 | 0 | 1 | 5 | 0.2 | 0.2 | 0.6 | 0 | 0 | 0 | 0 | 1 | 5 |

TABLE 2-continued

| | No. | Base material | Cr | Kind | Content | B | C | N | Film thickness (μm) | Nb | Cr | Al | Si | Y | B | C | N | Film thickness (μm) |
|---|---|---|---|---|---|---|---|---|---|---|---|---|---|---|---|---|---|---|
| | 48 | SKD11 | 1 | | 0 | 0 | 0 | 1 | 5 | 0.1 | 0.3 | 0.6 | 0 | 0 | 0 | 0 | 1 | 5 |
| | 49 | SKD11 | 1 | | 0 | 0 | 0 | 1 | 5 | 0.3 | 0.1 | 0.6 | 0 | 0 | 0 | 0 | 1 | 5 |
| | 50 | SKD11 | 1 | | 0 | 0 | 0 | 1 | 5 | 0.15 | 0.15 | 0.7 | 0 | 0 | 0 | 0 | 1 | 5 |
| Comparative Example | 51 | SKD11 | 1 | | 0 | 0 | 0 | 1 | 5 | 0.1 | 0.1 | 0.8 | 0 | 0 | 0 | 0 | 1 | 5 |

| | No. | Adhesion (N) | Film layer hardness (GPa) | Oxidation start temperature (°C.) | Wear depth (μm) |
|---|---|---|---|---|---|
| Example | 28 | 150 | 33 | 1150 | 1.7 |
| | 29 | 135 | 33 | 1150 | 1.6 |
| Comparative Example | 30 | 80 | 33 | 1150 | 6.2 |
| Example | 31 | 90 | 27 | 1000 | 7.5 |
| Example | 32 | 160 | 31 | 1100 | 2.7 |
| | 33 | 161 | 33 | 1200 | 1.2 |
| | 34 | 162 | 35 | 1100 | 0.9 |
| | 35 | 163 | 32 | 1100 | 2.2 |
| | 36 | 164 | 31 | 1000 | 2.7 |
| Comparative Example | 37 | 130 | 23 | 650 | 6.2 |
| Example | 38 | 120 | 26 | 900 | 6.9 |
| Example | 39 | 160 | 30 | 1050 | 2.8 |
| | 40 | 160 | 35 | 1100 | 0.9 |
| | 41 | 160 | 33 | 1200 | 1.2 |
| | 42 | 160 | 30 | 1150 | 2.3 |
| Comparative Example | 43 | 160 | 25 | 950 | 7 |
| Example | 44 | 160 | 22 | 600 | 7.5 |
| Example | 45 | 160 | 30 | 1000 | 2.8 |
| | 46 | 160 | 31 | 1100 | 1.1 |
| | 47 | 160 | 34 | 1150 | 0.7 |
| | 48 | 160 | 33 | 1200 | 0.8 |
| | 49 | 160 | 35 | 1100 | 0.6 |
| | 50 | 160 | 32 | 1200 | 3 |
| Comparative Example | 51 | 160 | 25 | 1200 | 5.3 |

TABLE 3

| | | | First film layer | | | | | | | Second film layer | | | | | | | | |
|---|---|---|---|---|---|---|---|---|---|---|---|---|---|---|---|---|---|---|
| | | | Composition (atomic ratio) | | | | | | Film thickness | Composition (atomic ratio) | | | | | | | | Film thickness |
| | | Base | | M | | | | | | | | | L | | | | | |
| | No. | material | Cr | Kind | Content | B | C | N | (μm) | Nb | Cr | Al | Si | Y | B | C | N | (μm) |
| Example | 52 | SKD11 | 1 | | 0 | 0 | 0 | 1 | 5 | 0.19 | 0.19 | 0.6 | 0.02 | 0 | 0 | 0 | 1 | 5 |
| | 53 | SKD11 | 1 | | 0 | 0 | 0 | 1 | 5 | 0.18 | 0.18 | 0.6 | 0.05 | 0 | 0 | 0 | 1 | 5 |
| | 54 | SKD11 | 1 | | 0 | 0 | 0 | 1 | 5 | 0.23 | 0.23 | 0.5 | 0.05 | 0 | 0 | 0 | 1 | 5 |
| | 55 | SKD11 | 1 | | 0 | 0 | 0 | 1 | 5 | 0.15 | 0.15 | 0.6 | 0.1 | 0 | 0 | 0 | 1 | 5 |
| | 56 | SKD11 | 1 | | 0 | 0 | 0 | 1 | 5 | 0.13 | 0.13 | 0.6 | 0.15 | 0 | 0 | 0 | 1 | 5 |
| Comparative Example | 57 | SKD11 | 1 | | 0 | 0 | 0 | 1 | 5 | 0.1 | 0.1 | 0.6 | 0.2 | 0 | 0 | 0 | 1 | 5 |
| Example | 58 | SKD11 | 1 | | 0 | 0 | 0 | 1 | 5 | 0.2 | 0.2 | 0.55 | 0.03 | 0.02 | 0 | 0 | 1 | 5 |
| | 59 | SKD11 | 1 | | 0 | 0 | 0 | 1 | 5 | 0.19 | 0.19 | 0.55 | 0.03 | 0.05 | 0 | 0 | 1 | 5 |
| | 60 | SKD11 | 1 | | 0 | 0 | 0 | 1 | 5 | 0.16 | 0.16 | 0.55 | 0.03 | 0.1 | 0 | 0 | 1 | 5 |
| | 61 | SKD11 | 1 | | 0 | 0 | 0 | 1 | 5 | 0.14 | 0.14 | 0.55 | 0.03 | 0.12 | 0 | 0 | 1 | 5 |
| Comparative Example | 62 | SKD11 | 1 | | 0 | 0 | 0 | 1 | 5 | 0.11 | 0.11 | 0.55 | 0.03 | 0.2 | 0 | 0 | 1 | 5 |
| Example | 63 | SKD11 | 1 | | 0 | 0 | 0 | 1 | 5 | 0.2 | 0.2 | 0.55 | 0 | 0 | 0.05 | 0 | 1 | 5 |
| Example | 64 | SKD11 | 1 | | 0 | 0 | 0 | 1 | 5 | 0.2 | 0.1 | 0.55 | 0 | 0 | 0.15 | 0 | 1 | 5 |
| Comparative Example | 65 | SKD11 | 1 | | 0 | 0 | 0 | 1 | 5 | 0.15 | 0.15 | 0.4 | 0 | 0 | 0.3 | 0 | 1 | 5 |
| Example | 66 | SKD11 | 1 | | 0 | 0 | 0 | 1 | 5 | 0.2 | 0.2 | 0.6 | 0 | 0 | 0 | 0.1 | 0.9 | 5 |
| Example | 67 | SKD11 | 1 | | 0 | 0 | 0 | 1 | 5 | 0.2 | 0.2 | 0.6 | 0 | 0 | 0 | 0.3 | 0.7 | 5 |
| Example | 68 | SKD11 | 1 | | 0 | 0 | 0 | 1 | 5 | 0.2 | 0.2 | 0.6 | 0 | 0 | 0 | 0.5 | 0.5 | 5 |
| Comparative Example | 69 | SKD11 | 1 | | 0 | 0 | 0 | 1 | 5 | 0.2 | 0.2 | 0.6 | 0 | 0 | 0 | 0.6 | 0.4 | 5 |

TABLE 3-continued

|  | No. | Adhesion (N) | Film layer hardness (GPa) | Oxidation start temperature (° C.) | Wear depth (μm) |
|---|---|---|---|---|---|
| Example | 52 | 160 | 33 | 1200 | 0.5 |
|  | 53 | 160 | 36 | 1250 | 0.4 |
|  | 54 | 160 | 36 | 1220 | 0.9 |
|  | 55 | 160 | 34 | 1250 | 1.8 |
|  | 56 | 160 | 33 | 1300 | 2.6 |
| Comparative Example | 57 | 160 | 22 | 1300 | 5.4 |
| Example | 58 | 160 | 34 | 1150 | 0.3 |
|  | 59 | 160 | 34 | 1200 | 0.7 |
|  | 60 | 160 | 31 | 1200 | 1.3 |
|  | 61 | 160 | 25 | 1250 | 3.7 |
| Comparative Example | 62 | 160 | 20 | 1250 | 7.5 |
| Example | 63 | 160 | 34 | 1200 | 1.7 |
| Example | 64 | 160 | 36 | 1200 | 1.2 |
| Comparative Example | 65 | 160 | 25 | 1050 | 6.8 |
| Example | 66 | 160 | 35 | 1150 | 1.9 |
| Example | 67 | 160 | 35 | 1100 | 1.3 |
| Example | 68 | 160 | 33 | 1100 | 2.1 |
| Comparative Example | 69 | 160 | 24 | 900 | 7 |

The results of Tables 1 to 3 indicate as follows: Examples (Nos. 4 to 18, 20 to 26, 28, 29, 32 to 36, 39 to 42, 45 to 50, 52 to 56, 58 to 61, 63, 64, and 66 to 68) each of which the composition and the film thickness of the film layer are within respective prescribed ranges are superior in adhesion and wear depth (wear resistance) to Comparative Examples (Nos. 1 to 3, 19, 27, 30, 31, 37, 38, 43, 44, 51, 57, 62, 65, and 69) each of which the composition and the film thickness of the film layer are outside respective prescribed ranges.

Example 2

By means of the deposition device having a plurality of arc evaporation sources (see FIG. 2), the film layers of the compositions shown in Table 4 were manufactured. Incidentally, as the base material, a SKD11 substrate (which had been heat treated to have a hardness of HRC60) was used.

Each base material shown in Table 4 was introduced into the chamber of the deposition device, and the inside of the chamber was evacuated (evacuated to $1\times10^{-3}$ Pa or less). Then, the base material was heated up to about 400° C. Thereafter, sputter cleaning was carried out with Ar ions. Then, using a 100 mm-dia target (evaporation source), deposition was carried out at an arc current of 150 A, in an atmosphere of $N_2$ with a total pressure of 4 Pa. The bias to be applied to the base material was −70 V.

For the deposition, first, a first film layer (film thickness 5 μm) was formed on the base material (substrate) using a target having the composition of the first film layer. Then, the evaporation source for forming the first film layer and the evaporation source for forming the second film layer were simultaneously discharged to form a lamination film including the third film layer and the fourth film layer. Incidentally, the deposition device shown in FIG. 2 is configured as follows. The positions of the two evaporation sources are separated from each other. Thus, a film layer is formed only when the base material passes through the front of one evaporation source. Therefore, even when the evaporation sources are simultaneously discharged, a mixed film layer is not formed. After the formation of the lamination film, the evaporation source was switched, and the second film layer (film thickness 5 μm) was formed on the lamination film by a target having the composition of the second film layer. Incidentally, the lamination cycle of the lamination film part was controlled by the rotation speed of the substrate (the respective film thicknesses of the third film layer and the fourth film layer were set half and half). The total film thickness of the lamination film was controlled by the deposition time. The results are shown in Table 4. The first film layer and the third film layer include CrN. The second film layer and the fourth film layer include $Nb_{0.2}Cr_{0.2}Al_{0.6}N$.

For the samples in each of which the film layer was formed in this manner, the scratch test and the sliding test were carried out under the same conditions as those of [Example 1] to measure the adhesion and wear depth (wear resistance). The results are shown in Table 4. At this step, the composition of the film layer and the composition of the lamination film were measured in the same manner as with [Example 1]

TABLE 4

|  |  |  | First film layer | | | Lamination film | | Second film layer | | | | | Test results | |
|---|---|---|---|---|---|---|---|---|---|---|---|---|---|---|
|  |  |  | Composition (atomic ratio) | | Film thickness | Lamination cycle (nm) | Total film thickness (μm) | Composition (atomic ratio) | | | | Film thickness (μm) | Adhesion (N) | Wear depth (μm) |
|  | No. | Base material | Cr | N | (μm) |  |  | Nb | Cr | Al | N |  |  |  |
| Example | 1A | SKD11 | 1 | 1 | 5 | No lamination film |  | 0.2 | 0.2 | 0.6 | 1 | 5 | 120 | 2.1 |
|  | 2A | SKD11 | 1 | 1 | 5 | 50 | 0.05 | 0.2 | 0.2 | 0.6 | 1 | 5 | 130 | 1.8 |
|  | 3A | SKD11 | 1 | 1 | 5 | 50 | 0.5 | 0.2 | 0.2 | 0.6 | 1 | 5 | 160 | 1.2 |

TABLE 4-continued

| | | First film layer | | | | | Second film layer | | | | | | |
| | | Composition | | | Lamination film | | | | | Film | | Test results | |
| No. | Base material | (atomic ratio) Cr | N | Film thickness (μm) | Lamination cycle (nm) | Total film thickness (μm) | Composition (atomic ratio) Nb | Cr | Al | N | thickness (μm) | Adhesion (N) | Wear depth (μm) |
|---|---|---|---|---|---|---|---|---|---|---|---|---|---|
| 4A | SKD11 | 1 | 1 | 5 | 50 | 1 | 0.2 | 0.2 | 0.6 | 1 | 5 | 160 | 0.9 |
| 5A | SKD11 | 1 | 1 | 5 | 50 | 2 | 0.2 | 0.2 | 0.6 | 1 | 5 | 160 | 0.8 |
| 6A | SKD11 | 1 | 1 | 5 | 50 | 5 | 0.2 | 0.2 | 0.6 | 1 | 5 | 160 | 0.6 |
| 7A | SKD11 | 1 | 1 | 5 | 50 | 7 | 0.2 | 0.2 | 0.6 | 1 | 5 | 160 | 0.6 |
| 8A | SKD11 | 1 | 1 | 5 | 50 | 10 | 0.2 | 0.2 | 0.6 | 1 | 5 | 160 | 0.6 |
| 9A | SKD11 | 1 | 1 | 5 | 5 | 1.5 | 0.2 | 0.2 | 0.6 | 1 | 5 | 160 | 0.7 |
| 10A | SKD11 | 1 | 1 | 5 | 10 | 1.5 | 0.2 | 0.2 | 0.6 | 1 | 5 | 160 | 0.6 |
| 11A | SKD11 | 1 | 1 | 5 | 50 | 1.5 | 0.2 | 0.2 | 0.6 | 1 | 5 | 160 | 0.6 |
| 12A | SKD11 | 1 | 1 | 5 | 100 | 1.5 | 0.2 | 0.2 | 0.6 | 1 | 5 | 160 | 1.4 |
| 13A | SKD11 | 1 | 1 | 5 | 300 | 1.5 | 0.2 | 0.2 | 0.6 | 1 | 5 | 140 | 1.9 |
| 14A | SKD11 | 1 | 1 | 5 | 500 | 1.5 | 0.2 | 0.2 | 0.6 | 1 | 5 | 120 | 2.1 |

Note)
Lamination film: (Third film layer) composition is the same as that of the first film layer, and (fourth film layer) composition is the same as that of the second film layer.

The results of Table 4 indicate as follows: Examples (Nos. 2A to 13A) each of which the lamination cycle and the total film thickness of the lamination film are within respective prescribed ranges have been improved in adhesion and wear depth (wear resistance) as compared with Examples (Nos. 1A and 14A) each of which the lamination cycle or the total film thickness is outside respective prescribed ranges.

Example 3

By means of the deposition device having a plurality of arc evaporation sources (see FIG. 2), the film layers of the compositions shown in Table 5 were manufactured. Each base material shown in Table 5 was introduced into the chamber of the deposition device, and the inside of the chamber was evacuated (evacuated to $1 \times 10^{-3}$ Pa or less). Then, the base material was heated up to about 400° C. Thereafter, sputter cleaning was carried out with Ar ions. Then, using a 100 mm-dia target (evaporation source), deposition was carried out at an arc current of 150 A, in an atmosphere of $N_2$ with a total pressure of 4 Pa. The bias to be applied to the base material was −70 V. Incidentally, the base materials include those not subjected to a heat treatment, and having a hardness of HRC30 for SKD11 (raw), and those subjected to a heat treatment, and having a hardness of HRC60 for SKD11.

For the deposition, first, a first film layer was formed on the base material (substrate) using a target having the composition of the first film layer. Then, the evaporation source for forming the first film layer and the evaporation source for forming the second film layer were simultaneously discharged to form a lamination film including the third film layer and the fourth film layer. After the formation of the lamination film, the evaporation source was switched, and the second film layer was formed on the lamination film by a target having the composition of the second film layer. Incidentally, the lamination cycle of the lamination film part was controlled by the rotation speed of the substrate (the respective film thicknesses of the third film layer and the fourth film layer were set half and half). The total film thickness of the lamination film was controlled by the deposition time. The results are shown in Table 5. The first film layer and the third film layer include CrN. The second film layer and the fourth film layer include $Nb_{0.2}Cr_{0.2}Al_{0.6}N$. Incidentally, for some base materials, prior to the formation of the first film layer, a diffusion treatment of plasma nitriding or plasma carburizing was carried out under the following conditions. Then, the first film layer was formed. Alternatively, the following procedure was also carried out; without forming the first film layer and the lamination film, the second film layer was formed on the base material.

(Plasma Nitriding Treatment)
    Temperature: 550° C.
    Time: 1 to 12 hours
    Atmosphere: nitrogen +5% Ar
    Pressure: 100 Pa
    Plasma source: direct current DC plasma (1500 V)
(Plasma Carburizing Treatment)
    Temperature: 950° C.
    Time: 1 to 12 hours
    Atmosphere: Ar+5% methane
    Pressure: 100 Pa
    Plasma source: direct current DC plasma (1500 V)

For the samples in each of which the film layer was formed in this manner, the scratch test and the sliding test were carried out under the same conditions as those in the case of [Example 1] to measure the adhesion and the wear depth (wear resistance) The results are shown in Table 5. At this step, the composition of the film layer, the composition of the lamination film, and the hardness of the base material were measured in the same manner as with [Example 1] and [Example 2]

TABLE 5

| | No. | Base material | | | | | First film layer | |
|---|---|---|---|---|---|---|---|---|
| | | Material kind | Diffusion treatment | Diffusion layer film thickness (μm) | Hardness (HRC) | Precipitated carbide | Film thickness 3 μm Composition (atomic ratio) | |
| Comparative Example | 1B | SKD11 | No diffusion layer | | 60 | Present | No first film layer | |
| Example | 2B | SKD11 | No diffusion layer | | 60 | Present | 1 | 1 |

TABLE 5-continued

| | No. | | | | | |
|---|---|---|---|---|---|---|
| Comparative Example | 3B | SKD61 | No diffusion layer | 50 | Present | No first film layer |
| Example | 4B | SKD61 | No diffusion layer | 50 | Present | 1 1 |
| Comparative Example | 5B | SKH51 | No diffusion layer | 65 | Present | No first film layer |
| Example | 6B | SKH51 | No diffusion layer | 65 | Present | 1 1 |
| Comparative Example | 7B | SUS304 | No diffusion layer | 10 | None | No first film layer |
| Example | 8B | SUS304 | No diffusion layer | 10 | None | 1 1 |
| Comparative Example | 9B | SUJ2 | No diffusion layer | 60 | None | No first film layer |
| Example | 10B | SUJ2 | No diffusion layer | 60 | None | 1 1 |
| Comparative Example | 11B | SKD11 (raw) | No diffusion layer | 30 | Present | No first film layer |
| Example | 12B | SKD11 (raw) | No diffusion layer | 30 | Present | 1 1 |
| | 13B | SKD11 | Nitriding | 5 | 60 | Present | 1 1 |
| | 14B | SKD11 | Nitriding | 10 | 60 | Present | 1 1 |
| | 15B | SKD11 | Nitriding | 50 | 60 | Present | 1 1 |
| | 16B | SKD11 | Nitriding | 100 | 60 | Present | 1 1 |
| | 17B | SKD11 | Carburizing | 100 | 60 | Present | 1 1 |
| | 18B | SKD11 | Carburizing | 500 | 60 | Present | 1 1 |
| | 19B | SKD11 | Carburizing | 1000 | 60 | Present | 1 1 |
| | 20B | SKD11 | Carburizing | 2000 | 60 | Present | 1 1 |

| | No. | Lamination film Lamination cycle (nm) | Total film thickness (μm) | Second film layer Film thickness 10 μm Composition (atomic ratio) Nb | Cr | Al | N | Test results Adhesion (N) | Wear depth (μm) |
|---|---|---|---|---|---|---|---|---|---|
| Comparative Example | 1B | No lamination film | | 0.2 | 0.2 | 0.6 | 1 | 80 | 5.3 |
| Example | 2B | 50 | 1 | 0.2 | 0.2 | 0.6 | 1 | 160 | 0.4 |
| Comparative Example | 3B | No lamination film | | 0.2 | 0.2 | 0.6 | 1 | 75 | 7 |
| Example | 4B | 50 | 1 | 0.2 | 0.2 | 0.6 | 1 | 120 | 0.5 |
| Comparative Example | 5B | No lamination film | | 0.2 | 0.2 | 0.6 | 1 | 90 | 5 |
| Example | 6B | 50 | 1 | 0.2 | 0.2 | 0.6 | 1 | 160 | 0.4 |
| Comparative Example | 7B | No lamination film | | 0.2 | 0.2 | 0.6 | 1 | 55 | More than 10 |
| Example | 8B | 50 | 1 | 0.2 | 0.2 | 0.6 | 1 | 120 | 2.9 |
| Comparative Example | 9B | No lamination film | | 0.2 | 0.2 | 0.6 | 1 | 120 | 8 |
| Example | 10B | 50 | 1 | 0.2 | 0.2 | 0.6 | 1 | 140 | 1.2 |
| Comparative Example | 11B | No lamination film | | 0.2 | 0.2 | 0.6 | 1 | 50 | More than 10 |
| Example | 12B | 50 | 1 | 0.2 | 0.2 | 0.6 | 1 | 120 | 3 |
| | 13B | 50 | 1 | 0.2 | 0.2 | 0.6 | 1 | 160 | 1.4 |
| | 14B | 50 | 1 | 0.2 | 0.2 | 0.6 | 1 | 180 | 1.2 |
| | 15B | 50 | 1 | 0.2 | 0.2 | 0.6 | 1 | 190 | 0.4 |
| | 16B | 50 | 1 | 0.2 | 0.2 | 0.6 | 1 | More than 200 | 0.4 |
| | 17B | 50 | 1 | 0.2 | 0.2 | 0.6 | 1 | 180 | 0.5 |
| | 18B | 50 | 1 | 0.2 | 0.2 | 0.6 | 1 | More than 200 | 0.55 |
| | 19B | 50 | 1 | 0.2 | 0.2 | 0.6 | 1 | More than 200 | 0.5 |
| | 20B | 50 | 1 | 0.2 | 0.2 | 0.6 | 1 | More than 200 | 0.6 |

Note)
Lamination film: (Third film layer) composition is the same as that of the first film layer, and (fourth film layer) composition is the same as that of the second film layer.

The results of Table 5 indicate as follows. Examples (No. 2B, 4B, 6B, and 13B to 20B) each of which the hardness of the base material was within the prescribed range, and each of which was subjected to a diffusion treatment have been improved in adhesion and wear depth (wear resistance) as compared with Examples (Nos. 8B and 12B) each of which the hardness of the base material was outside the prescribed range, and Example (No. 10B) not subjected to a diffusion treatment. Whereas, Comparative Examples with neither first film layer nor lamination film formed therein (Nos. 1B, 3B, 5B, 7B, 9B and 11B) were inferior in adhesion and wear depth (wear resistance).

Example 4

By means of the deposition device having a plurality of arc evaporation sources (FIG. 2), the film layers were manufactured. Incidentally, as the base material, a SKD11 substrate (which had been heat treated to have a hardness of HRC60) was used.

Each substrate shown in Table 6 was introduced into the chamber of the deposition device, and the inside of the chamber was evacuated (evacuated to $1 \times 10^{-3}$ Pa or less). Then, the base material was heated up to about 400° C. Thereafter, sputter cleaning was carried out with Ar ions. Then, using a 100 mm-dia target (evaporation source), various film layers were formed at an arc current of 150 A, under the conditions of bias voltage and nitrogen pressure shown in Table 6.

For the deposition, first, a first film layer (film thickness 5 μm) was formed on the base material (substrate) using a target having the composition of the first film layer. Then, the evaporation source for forming the first film layer and the evaporation source for forming the second film layer were simultaneously discharged to form a lamination film including the third film layer and the fourth film layer. After the formation of the lamination film, the evaporation source was switched, and the second film layer (film thickness 5 μm) was formed on the lamination film by a target having the composition of the second film layer. Incidentally, the lamination cycle of the lamination film part was controlled by the rotation speed of the substrate, and the total film thickness was controlled by the deposition time. The first film layer and the third film layer include CrN. The second film layer and the fourth film layer include $Nb_{0.2}Cr_{0.2}Al_{0.6}N$. The lamination cycle of the lamination film was set at 50 nm (the respective film thicknesses of the third film layer and the fourth film layer were set half and half) The total film thickness was set at 1 μm.

For samples in each of which the film layer was formed in this manner, the compositions of the film layer and the lamination film, the adhesion of the film layer, the hardness, the oxidation start temperature, and the wear depth were measured in the same manner as with [Example 1] and [Example 2]. As for the crystal structure (peak intensity ratio) of the film layer, by means of an X-ray diffraction device using Cukα, the peak intensities of the diffraction lines belonging to the hexagonal crystal, the cubic crystal, and the metal Nb were measured with a θ-2θ method to calculate the peak intensity ratio (hexagonal crystal/cubic crystal, metal Nb/cubic crystal). The results are shown in Table 6.

TABLE 6

| | | | First film layer | | Lamination film | | Second film layer | | | | | | |
|---|---|---|---|---|---|---|---|---|---|---|---|---|---|
| | | | Composition (atomic ratio) | Total film thickness | | Total film thickness | Composition (atomic ratio) | | | | Film thickness | Bias voltage | Nitrogen pressure |
| | No. | Base material | Cr  N | (μm) | Lamination cycle (nm) | (μm) | Nb | Cr | Al | N | (μm) | (−V) | (Pa) |
| Example | 1C | SKD11 | 1  1 | 5 | 50 | 1 | 0.2 | 0.2 | 0.6 | 1 | 5 | 0 | 4 |
| | 2C | SKD11 | 1  1 | 5 | 50 | 1 | 0.2 | 0.2 | 0.6 | 1 | 5 | 10 | 4 |
| | 3C | SKD11 | 1  1 | 5 | 50 | 1 | 0.2 | 0.2 | 0.6 | 1 | 5 | 15 | 4 |
| | 4C | SKD11 | 1  1 | 5 | 50 | 1 | 0.2 | 0.2 | 0.6 | 1 | 5 | 30 | 4 |
| | 5C | SKD11 | 1  1 | 5 | 50 | 1 | 0.2 | 0.2 | 0.6 | 1 | 5 | 70 | 4 |
| | 6C | SKD11 | 1  1 | 5 | 50 | 1 | 0.2 | 0.2 | 0.6 | 1 | 5 | 100 | 4 |
| | 7C | SKD11 | 1  1 | 5 | 50 | 1 | 0.2 | 0.2 | 0.6 | 1 | 5 | 150 | 4 |
| | 8C | SKD11 | 1  1 | 5 | 50 | 1 | 0.2 | 0.2 | 0.6 | 1 | 5 | 200 | 4 |
| Comparative Example | 9C | SKD11 | 1  1 | Thin | 50 | 1 | 0.2 | 0.2 | 0.6 | 1 | Thin | 300 | 4 |
| Example | 10C | SKD11 | 1  1 | 5 | 50 | 1 | 0.2 | 0.2 | 0.6 | 1 | 5 | 70 | 0.5 |
| | 11C | SKD11 | 1  1 | 5 | 50 | 1 | 0.2 | 0.2 | 0.6 | 1 | 5 | 70 | 2 |
| | 12C | SKD11 | 1  1 | 5 | 50 | 1 | 0.2 | 0.2 | 0.6 | 1 | 5 | 70 | 4 |
| | 13C | SKD11 | 1  1 | 5 | 50 | 1 | 0.2 | 0.2 | 0.6 | 1 | 5 | 70 | 8 |
| | 14C | SKD11 | 1  1 | 5 | 50 | 1 | 0.2 | 0.2 | 0.6 | 1 | 5 | 70 | 10 |
| Comparative Example | 15C | SKD11 | 1  1 | Thin | 50 | 1 | 0.2 | 0.2 | 0.6 | 1 | Thin | 70 | 15 |
| Example | 16C | SKD11 | 1  1 | 5 | 0 | 0 | 0.2 | 0.2 | 0.6 | 1 | 5 | 70 | 4 |

| | | Second film layer | | Test results | | |
|---|---|---|---|---|---|---|
| | | Peak intensity ratio | | | Oxidation | |
| | No. | Hexagonal crystal/cubic crystal | Metal Nb/cubic crystal | Adhesion (N) | Film layer hardness (GPa) | start temperature (° C.) | Wear depth (μm) |
| Example | 1C | 2 | 0.8 | 120 | 30 | 1150 | 2.8 |
| | 2C | 1.5 | 0.5 | 130 | 31 | 1150 | 1.8 |
| | 3C | 1.3 | 0.5 | 130 | 31 | 1150 | 1.2 |
| | 4C | 0.5 | 0.3 | 160 | 33 | 1150 | 0.8 |
| | 5C | 0.05 | 0.1 | 160 | 33 | 1150 | 0.4 |
| | 6C | 0 | 0.1 | 160 | 33 | 1150 | 0.5 |
| | 7C | 0 | 0.1 | 160 | 33 | 1150 | 0.5 |
| | 8C | 0 | 0.1 | 160 | 33 | 1150 | 0.6 |
| Comparative Example | 9C | 0 | 0.1 | 160 | 33 | 1150 | — |
| Example | 10C | 1.2 | 1.5 | 160 | 30 | 1150 | 2.5 |
| | 11C | 0.5 | 0.8 | 160 | 33 | 1150 | 1.3 |
| | 12C | 0.05 | 0.1 | 160 | 33 | 1150 | 0.5 |
| | 13C | 0 | 0.05 | 160 | 33 | 1150 | 0.6 |
| | 14C | 0 | 0 | 160 | 33 | 1150 | 1.2 |

TABLE 6-continued

|  | | | | | | | |
|---|---|---|---|---|---|---|---|
| Comparative Example | 15C | 0 | 0 | 160 | 33 | 1150 | — |
| Example | 16C | 0.05 | 0.1 | 130 | 33 | 1150 | 1.4 |

Note)
Lamination film: (Third film layer) composition is the same as that of the first film layer, and (fourth film layer) composition is the same as that of the second film layer.

The results of Table 6 indicate as follows. Examples (Nos. 4C to 8C, 11C to 14C, and 16C) each of which the peak intensity ratio of the second film layer (bias voltage, nitrogen pressure) is within the prescribed range have been improved in adhesion and wear depth (wear resistance) as compared with Examples (Nos. 1C to 3C, and 10C) each of which the peak intensity ratio (bias voltage, nitrogen pressure) is outside the prescribed range.

Incidentally, for Comparative Examples (Nos. 9C and 15C) of Table 6, the bias voltage is high, and priority is given to etching than to deposition, or the nitrogen pressure is very high, and the deposition rate is very low. Therefore, even when deposition was carried out for the same time, only a very thin film layer could be formed (the film thicknesses of the first film layer and the second film layer were outside the prescribed ranges).

What is claimed is:

1. A hard film-coated member, comprising: a base material including an iron base alloy containing Cr; a first film layer formed with a film thickness of 1 to 10 µm on the surface of the base material; and a second film layer formed with a film thickness of 2 to 10 µm on the surface of the first film layer, wherein the first film layer comprises $Cr_{1-a-b}M_aB_b(C_cN_{1-c})$, in which M is one or more elements selected from W, V, Mo, Nb, Ti, and Al, and a, b, and c each denote the atomic ratio, and satisfy the following relations:

$0 \leq a \leq 0.7$;

$0 \leq b \leq 0.15$;

$0 \leq c \leq 0.5$; and $0.5 \leq 1a-b$, and, the second film layer comprises $Nb_{1-d-e-f}Cr_dAl_eL_f(C_gN_{1-g})$, in which L is one or more elements selected from Si, Y, and B, and d, e, f, and g each denote the atomic ratio, and satisfy the following relations:

$0.05 \leq 1-d-e-f \leq 0.5$;

$0.05 \leq d \leq 0.5$;

$0.4 \leq e \leq 0.7$;

$0 \leq f \leq 0.15$; and $0 \leq g \leq 0.5$.

2. The hard film-coated member according to claim 1, wherein
the first film layer comprises CrN of $Cr_{1-a-b}M_aB_b(C_cN_{1-c})$, in which a=0, b=0, and c=0, and
the second film layer comprises $Nb_{1-d-e}Cr_dAl_eN$ of $Nb_{1-d-e-f}Cr_dAl_eL_f(C_gN_{1-g})$, in which f=0 and g=0, and d and e satisfy the following relations:

$0.1 \leq 1-d-e \leq 0.3$;

$0.1 \leq d \leq 0.3$; and $0.5 \leq e \leq 0.6$.

3. The hard film-coated member according to claim 2, wherein the crystal structure of the second film layer has a single phase consisting only of a cubic rock salt type structure, or a composite phase including a cubic rock salt type structure and a hexagonal type structure mixed therein, and
in the case of the composite phase, peak intensity ratio (Ih/Ic)≦1 is satisfied, where Ic denotes the cubic peak intensity which is the larger peak intensity of the peak intensities of the (111) plane and the (200) plane of the cubic crystal, and Ih denotes the hexagonal peak intensity which is the largest peak intensity of the peak intensities of the (100) plane, the (002) plane and the (101) plane of the hexagonal crystal, measured by means of an X-ray diffraction device.

4. The hard film-coated member according to claim 2, wherein the crystal structure of the second film layer includes a cubic rock salt type structure, and peak intensity ratio (In/Ic)≦1 is satisfied, based on comparison with In, where Ic denotes the cubic peak intensity which is the larger peak intensity of the peak intensities of the (111) plane and the (200) plane of the cubic crystal measured by means of an X-ray diffraction device, and In denotes the peak intensity of the (110) plane of metal Nb.

5. The hard film-coated member according to claim 2, wherein the second film layer is formed with a cathode discharge type arc ion plating evaporation method, and for forming the second film layer, the bias voltage of the substrate set in a device for use in the cathode discharge type arc ion plating evaporation method is −30 to −200 V.

6. The hard film-coated member according to claim 2, wherein the second film layer is formed with a cathode discharge type arc ion plating evaporation method, and for forming the second film layer, the nitrogen pressure in a device for use in the cathode discharge type arc ion plating evaporation method is 2 to 10 Pa.

7. The hard film-coated member according to claim 1, wherein
the first film layer comprises CrN of $Cr_{1-a-b}M_aB_b(C_cN_{1-c})$, in which a=0, b=0, and c=0, and
the second film layer comprises $Nb_{1-d-e-f}Cr_dAl_eSi_fN$ of $Nb_{1-d-e-f}Cr_dAl_eL_f(C_gN_{1-g})$, in which g=0, and L is Si, and d, e, and f satisfy the following relations:

$0.1 \leq 1-d-e-f \leq 0.3$;

$0.1 \leq d \leq 0.3$;

$0.5 \leq e \leq 0.6$; and $0.01 \leq f \leq 0.05$.

8. The hard film-coated member according to claim 1, further comprising a lamination film including a third film layer and a fourth film layer alternately stacked between the first film layer and the second film layer, wherein
the third film layer comprises $Cr_{1-a-b}M_aB_b(C_cN_{1-c})$, and the film thickness of the third film layer is smaller than the film thickness of the first film layer, the fourth film layer comprises $Nb_{1-d-e-f}Cr_dAl_eL_f(C_gN_{1-g})$, and the film thickness of the fourth film layer is smaller than the film thickness of the second film layer, and the lamination cycle of the lamination film is 300 nm or less, and the total film thickness of the lamination film is 0.05 μm or more.

9. The hard film-coated member according to claim 1, wherein the base material contains a Cr-containing precipitated carbide, and the Rockwell hardness of the base material is HRC50 or more.

10. The hard film-coated material according to claim 9, further comprising a diffusion layer formed by nitriding, carburizing, or carbonitriding of the base material, between the base material and the first film layer.

11. A jig for molding, comprising the hard film-coated member according to claim 1.

* * * * *